United States Patent
van Veldhoven et al.

(10) Patent No.: US 8,587,299 B2
(45) Date of Patent: Nov. 19, 2013

(54) MAGNETIC FIELD SENSOR

(75) Inventors: Robert Hendrikus Margaretha van Veldhoven, Dommelen (NL); Andreas Bernardus Maria Jansman, Nuenen (NL); Jaap Ruigrok, Asten (NL)

(73) Assignee: NXP B.V., Eindhoven (NL)

( * ) Notice: Subject to any disclaimer, the term of this patent is extended or adjusted under 35 U.S.C. 154(b) by 380 days.

(21) Appl. No.: 12/949,841

(22) Filed: Nov. 19, 2010

(65) Prior Publication Data

US 2011/0285395 A1   Nov. 24, 2011

(51) Int. Cl.
*G01R 33/02* (2006.01)
*G01R 33/09* (2006.01)

(52) U.S. Cl.
USPC ...................................... 324/252; 324/207.21

(58) Field of Classification Search
USPC ............................................ 324/252, 207.21
See application file for complete search history.

(56) References Cited

U.S. PATENT DOCUMENTS

| 7,592,803 B1 | 9/2009 | Guo et al. |
| 2005/0150295 A1 | 7/2005 | Wright |
| 2010/0001723 A1 | 1/2010 | Van Zon |

FOREIGN PATENT DOCUMENTS

| CN | 101088019 A | 12/2007 |
| CN | 101523214 A | 9/2009 |
| JP | 59-111011 A | 6/1984 |
| JP | 8-105744 A | 4/1996 |
| JP | 9-270550 A | 10/1997 |
| JP | 2009-250931 A | 10/2009 |
| WO | 2008/044162 A2 | 4/2008 |

OTHER PUBLICATIONS

Extended European Search Report for European Patent Appln. No. 09176469.6 (May 4, 2010).

*Primary Examiner* — Reena Aurora

(57) ABSTRACT

An AMR sensor, comprises at least first and second AMR sensor elements to which opposite bias fields are applied. The first and second AMR sensor element outputs are combined to derive a sensor response which is substantially anti-symmetric in the region close to zero external magnetic field. This arrangement shifts the zero detection point of the AMR sensor elements away from a maximum of the response curve, so that sensitivity in proximity to a zero input field is obtained. To overcome the problem that the response is not anti-symmetric, the signals from (at least) two sensor elements are combined.

13 Claims, 7 Drawing Sheets

MAGNETIC FIELD SENSOR

This application claims the priority under 35 U.S.C. §119 of European patent application no. 09176469.6, filed on Nov. 19, 2009, the contents of which are incorporated by reference herein.

FIELD OF THE INVENTION

The invention relates to magnetic field sensors. In particular, the invention relates to AMR (anisotropic magnetoresistive) sensor applications for magnetic field zero-crossing detection and other magnetic field sensor applications that require the best possible linearity.

BACKGROUND OF THE INVENTION

Magnetic sensors are increasingly important in various industries. In the automotive industry sensors in particular, various sensors such as parking sensors, angular sensors, ABS (Automatic Braking System) sensors and tyre pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors.

Several different magnetic sensor technologies are currently available, such as sensors based on the Hall effect or the magnetoresistive effect. Anisotropic magnetoresistive (AMR) and giant magnetoresistive (GMR) sensors are particular examples of sensor types based on the magnetoresistive effect. Hall effect sensors can be integrated monolithically into integrated circuits, which makes them cheap, but they are also known for their low sensitivity and consequent inaccuracy. AMR sensors, while having a much higher sensitivity compared to Hall effect sensors, require more fabrication steps because they cannot be integrated monolithically, making a total sensor system more expensive. AMR sensors can be deposited, usually by sputtering of $Ni_{80}Fe_{20}$ on a separate die or on top of a monolithic structure. An annealing process, sometimes in a magnetic field, is often used for increased stabilisation of the magnetic state in the magnetoresistive material.

GMR sensors typically have a higher sensitivity than AMR sensors. However, a GMR sensor consists of various thin layers and critical interfaces. The technology required to fabricate such sensors is considerably more complicated and expensive. Furthermore, due to the thin multiple layers making up a GMR sensor, the operating temperature range is also limited. Therefore often AMR sensors are chosen as a good compromise in magnetic sensor applications.

An AMR sensor (101) is sketched in FIG. 1 left. The AMR sensor is supplied by a sense current $I_{sense}$ that can be extracted from for example a reference voltage $V_{ref}$ in series with a resistor R. A typical AMR transfer function, defined as the AMR sensor resistance, $R_{AMR}$, as a function of the applied (or external) magnetic field, $H_{ext}$, is displayed in FIG. 1 right (102). The transfer function is symmetrical with respect to the y-axis and consequently has vanishing sensitivity near the zero crossings of $H_{ext}$. This strongly hampers an accurate detection of zero-field crossings: for such a symmetrical transfer curve, electronic noise and other disturbing electronic signals have a large impact at and around $H_{ext}=0$.

One known way to tackle this problem is the addition of a coil on top of the AMR sensor, see FIG. 2 left (201). When a DC current ($I_{bias}$) is driven through the coil, an additional field $H_{bias}$ is generated in the AMR sensor. The bias point of the AMR sensor is now shifted from 0 (202) to $H_{bias}$ (203) on the AMR transfer function, see FIG. 2 right. The AMR is now sensitive at zero $H_{ext}$ and its response to a sinusoidal $H_{ext}$ of the AMR sensor might look like the one depicted in FIG. 2 right.

Unfortunately, a difference in positive and negative half periods is visible due to the not purely anti-symmetric transfer curve that is generally obtained by the DC bias. Therefore, the zero-crossings of the external field do not coincide with the average value of the resistance of the sensor. So, this average value can not be used to detect the zero-field crossings. Moreover, the deviation of the actual zero-field crossings from this average AMR resistance level depends from the amplitude of the external field (and also from the size of the bias field, the shape of the transfer curve etc.) This hampers a robust and reliable detection of the zero field crossings from a single AC AMR output signal.

Because the transfer curve is not purely anti-symmetric (about the point 203), even order distortion components arise. In other words, if a sinusoidal field $H_{ext}$ is applied to the sensor, a spectral analysis (FFT) on the AMR sensor output resistance shows not only the odd harmonics from a purely anti-symmetric transfer curve but also some even harmonics resulting from the (shifted) symmetrical nature of the transfer curve.

One known approach to address these problems is the use of barber poles in the AMR sensors. These force current flow in the sensors to follow a certain direction. A disadvantage of barber pole type sensor elements is that the output curve changes its sign when the magnetization flips everywhere in the element, for example due to a large field spike. This would lead to a wrong interpretation of the sign of the applied field. A reduced sensitivity results if only a small part of an element flips. When this effect is not equal in the two elements, which is most likely, it leads to a NOT purely anti-symmetric output and this leads to 'distortion' of the zero crossings. The above described wrong states might be permanent until a next large field pulse occurs.

There is therefore a need for an AMR sensor configuration in which zero point crossings can be detected more easily and reliably.

SUMMARY OF THE INVENTION

According to the invention, there is provided an AMR sensor, comprising:
  at least first and second AMR sensor elements;
  means for applying a first DC bias field to the first AMR sensor element and a second, opposite, DC bias field to the second AMR sensor element; and
  means for combining the first and second AMR sensor element outputs to derive a sensor response which is substantially anti-symmetric in the region close to zero external magnetic field.

This arrangement shifts the zero detection point of the AMR sensor elements away from a maximum of the response curve, so that sensitivity in proximity to a zero input field is obtained. To overcome the problem that the response is not anti-symmetric, the signals from (at least) two sensor elements are combined.

The means for applying a DC bias preferably provides the first DC bias field with a component in a first sensitive direction and provides the second DC bias field with a component in an opposite sensitive direction.

The means for applying a DC bias can comprise a coil or a plurality of coils in proximity to the sensor elements (for example one per sensor element or one coil overlying multiple sensor elements).

The means for combining can be implemented as a circuit configuration, for example it can comprise a circuit configuration with the first and second sensor elements in series with an output voltage defined at the junction between the sensor elements. In this way, the output voltage is dependent on the difference between the resistances of the sensor elements.

A differential amplifier can be used for measuring the output voltage from a bridge. This set up highly suppresses noise from the voltage source that supplies the bridge.

In another example, the circuit configuration has its first and second sensor elements connected to the input terminals of a differential amplifier.

There can be two pairs of AMR sensor elements in two parallel circuit branches.

This enables improved differential sensing. For example:
the first branch can comprise a first AMR sensor element to which the first DC bias field is applied and a second AMR sensor element to which the second DC bias field is applied, in series from a high to low supply terminal; and
the second branch can comprise a first AMR sensor element to which the second DC bias field is applied and a second AMR sensor element to which the first DC bias field is applied, in series from the high to low supply terminal.

The external field to be detected is preferably aligned along the most sensitive direction of the AMR sensor elements for example perpendicular to each of the AMR sensor elements.

The invention also provides an AMR sensing method, comprising:
applying a first DC bias field to a first AMR sensor element;
applying a second, opposite, DC bias field to a second AMR sensor element; and
combining the first and second AMR sensor element outputs to derive a sensor response which is substantially anti-symmetric in the region close to zero external magnetic field.

BRIEF DESCRIPTION OF DRAWINGS

Examples of the invention will now be described in detail with reference to the accompanying drawings, in which.

DETAILED DESCRIPTION OF EMBODIMENTS

The invention provides an AMR sensor with at least two AMR sensor elements to which opposite bias fields are applied. The first and second AMR sensor element outputs are combined to derive a sensor response which is substantially anti-symmetric in the region close to zero external magnetic field.

In this way, the detection of a zero crossing is enabled. A strong output results that is free from differences in shape between positive and negative half periods of the external field.

Figure 1:
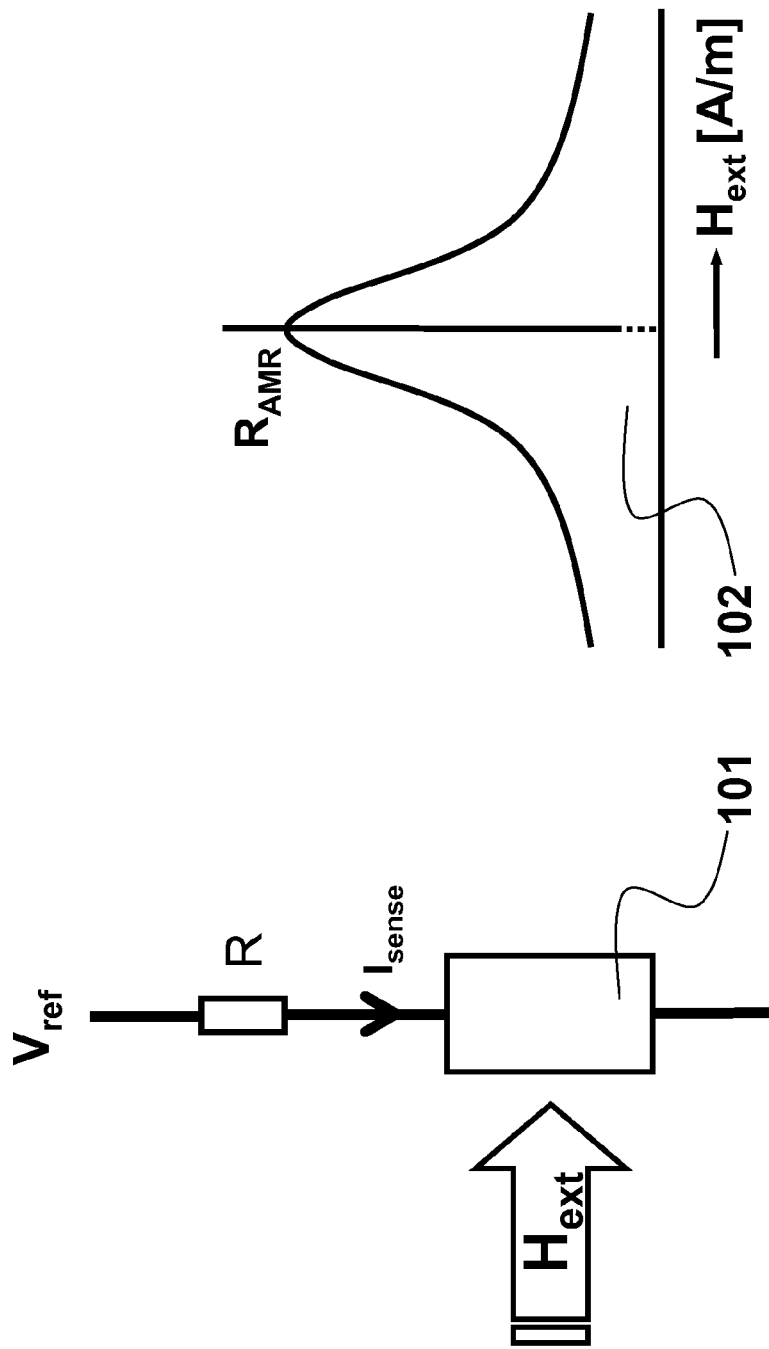
FIG. 1 shows a known AMR sensor and the typical AMR transfer function.
Figure 2:
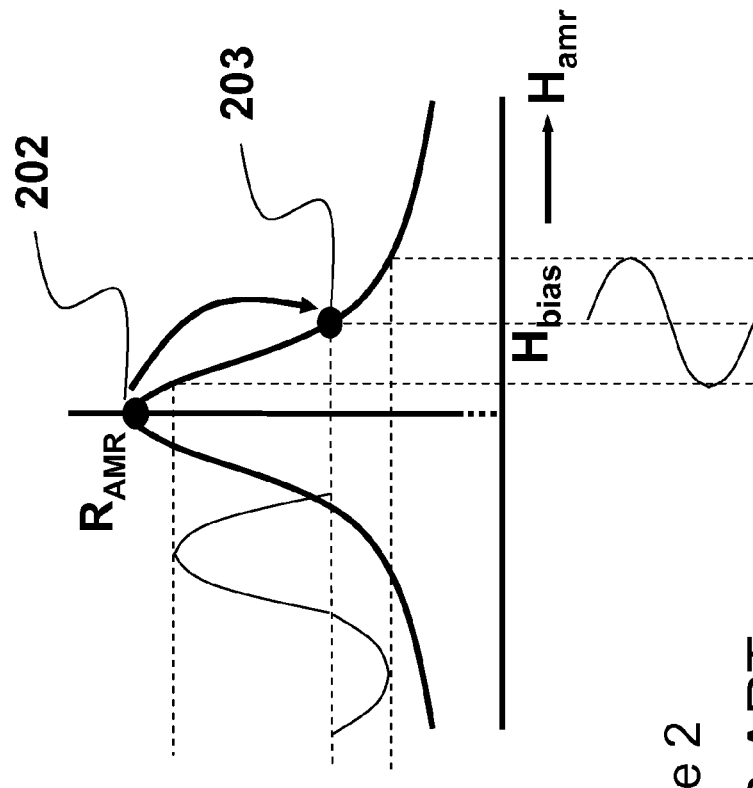
FIG. 2 shows the sensor of FIG. 1 with the addition of a coil on top and the modified AMR transfer function.
Figure 2:
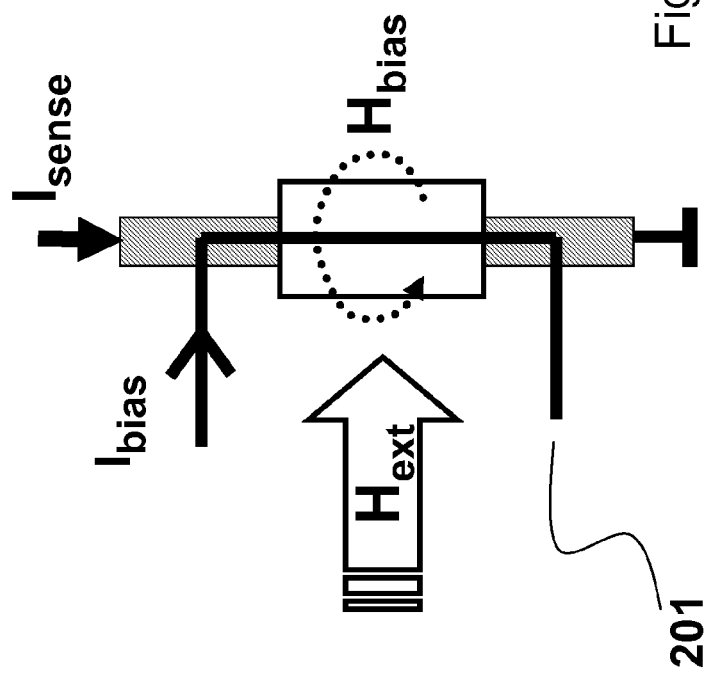
Figure 3:
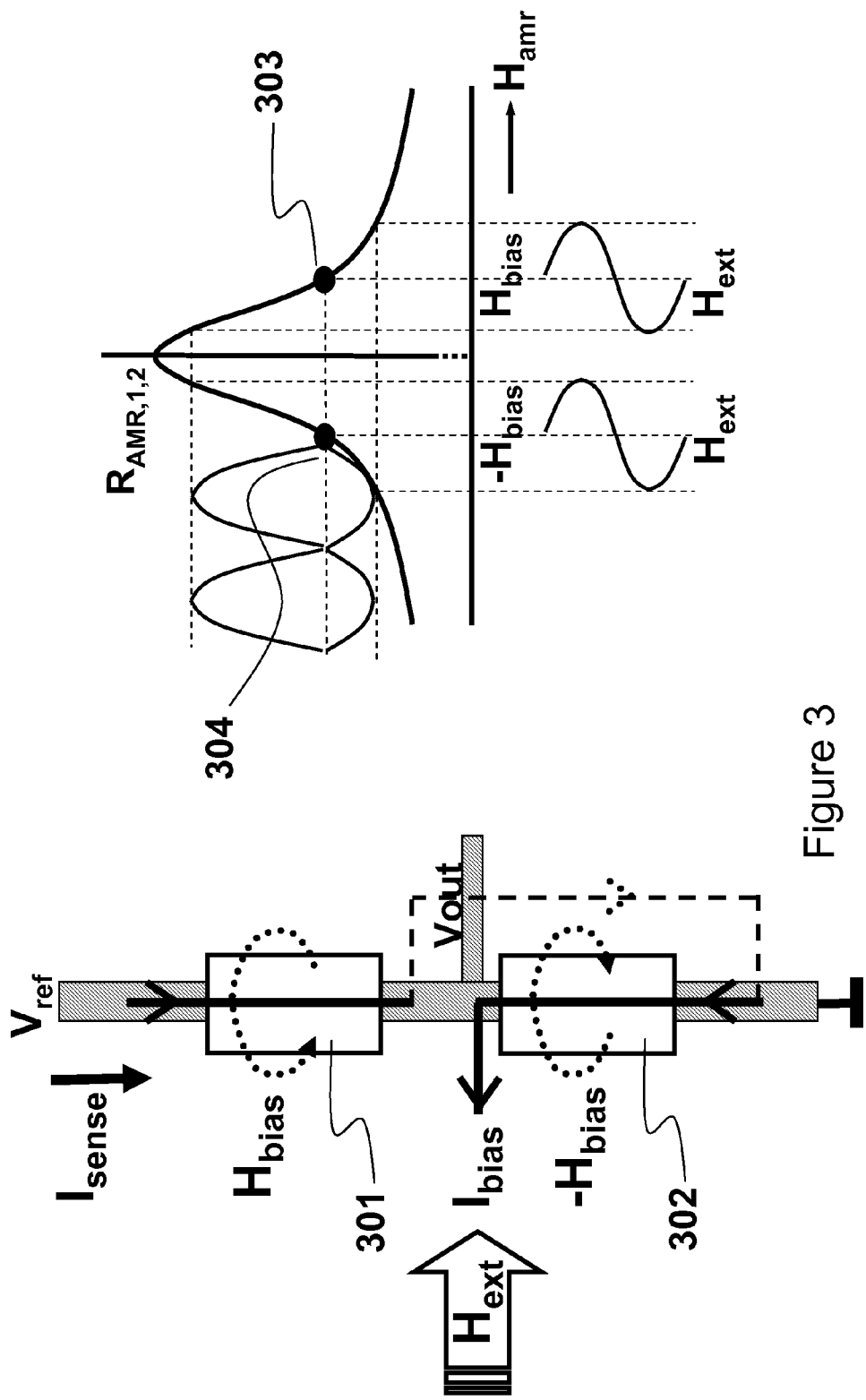
FIG. 3 shows a first example of an AMR sensor of the invention and the transfer function.

For example, the difference in positive and negative half periods can be removed when the two 180°-shifted output signals shown in FIG. 3 are subtracted from each other. In FIG. 3 left, the corresponding two sensors (301+302) are placed in series, and are connected to a DC reference voltage $V_{ref}$ and ground in order to provide them with a sense current, $I_{sense}$. The local bias fields can be generated by placing a single coil or two separate coils on top of the two AMR sensors. The coil current $I_{bias}$ generates a field $+H_{bias}$ in the upper and $-H_{bias}$ in the lower AMR (or vice versa).

At least a component of the DC bias field is parallel to the sensitive direction of the AMR sensors. A possible other component of the DC bias field parallel to the longest dimension of the AMR element can be useful for extra stability of the elements.

The external field is preferably in the most sensitive direction, which is usually perpendicular to the longest dimension of the elements.

Both sensors have an opposite bias point. Sensor 301 has bias point 303, and sensor 302 has bias point 304. The two AMR resistances now cross each other at the moment of the zero crossing in the external field, $H_{ext}=0$. When both sensors are supplied with the same sense current and the difference between both sensor signals is amplified using a differential amplifier, then the zero of the strong output signal corresponds to the zero of the external field: the zero crossing is 'undistorted'.

An additional advantage of such a differential AMR sensor is that temperature drift and other common disturbing signal are highly cancelled.

Figure 4:
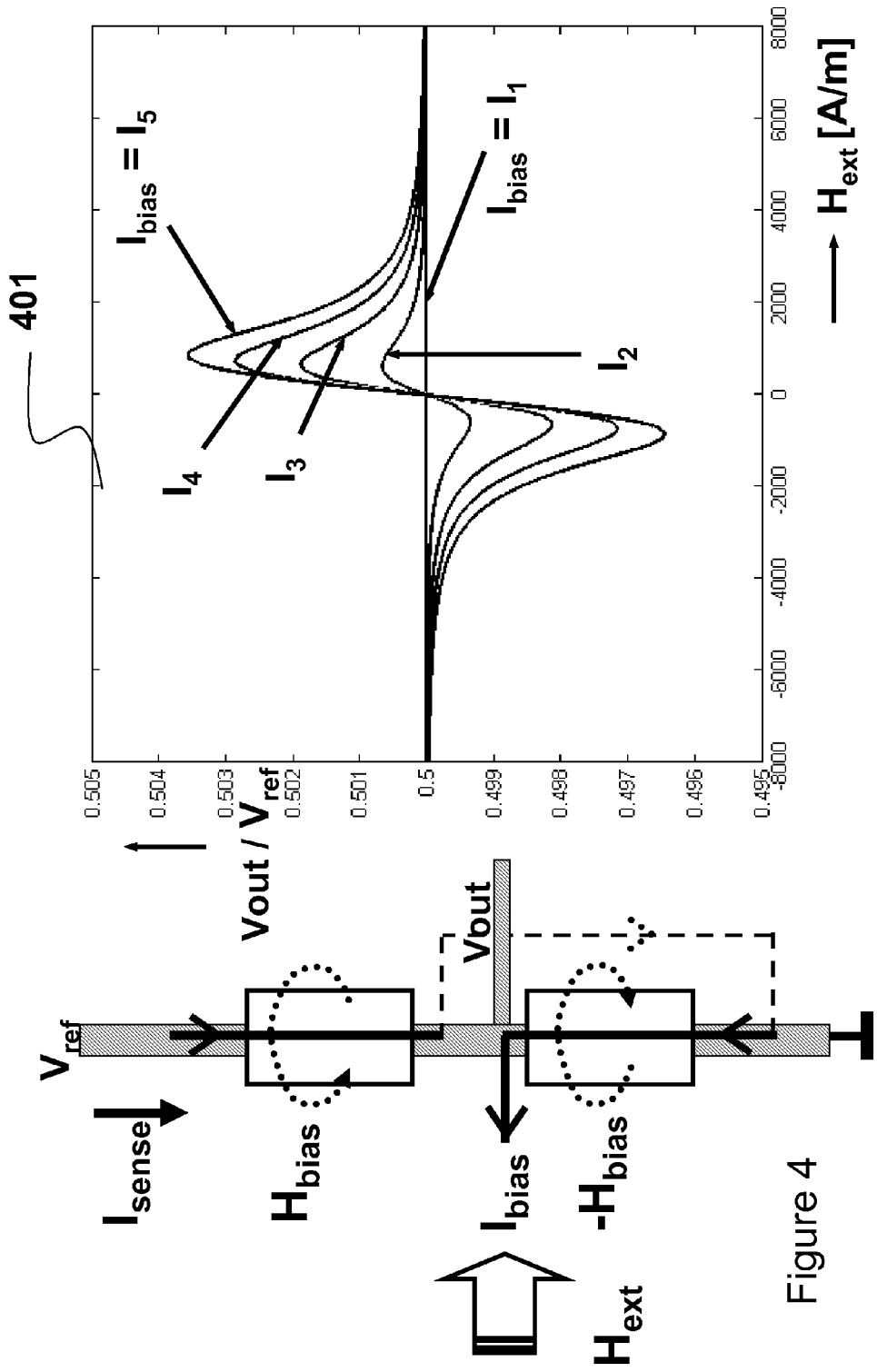
FIG. 4 shows the transfer function of the sensor of FIG. 3 arranged as a differential sensor.

The transfer function of the sensor combination is displayed in FIG. 4 (401). In the figure, the output voltage $V_{out}$ is displayed for different coil currents. For zero bias current (curve $I_1$) sensitivity is zero, as both AMR sensors are in the top of the AMR curve (same bias point) where there is no sensitivity. If an external field is added to both sensors, the AMR resistance of both sensors is equal, and the output of the half-bridge will be always $0.5V_{ref}$. At increasing coil currents (curves $I_2$-$I_5$, respectively) sensitivity becomes larger, as the bias points shift towards a steeper part of the AMR curve. For very large coil currents, sensitivity reduces again, as the bias points shift into the flat skirts of the AMR curve where there is little or no sensitivity, but this is not shown in FIG. 4.

The transfer functions of FIG. 4 are purely anti-symmetric (or odd), which means that their zero crossings are not 'distorted', i.e. they coincide with the zero crossings in $H_{ext}$. Furthermore the transfer function of the AMR half bridge is linearized around zero, which means that for small sinusoidal fields $H_{ext}$ the output of the half bridge will be sinusoidal with very little distortion.

In the configuration according to the invention, complete flipping of the magnetization of the AMR sensor is not an issue (in contrast to the case of barber pole approaches), as the AMR resistance value before and after complete flipping is the same (this is true when no DC bias field component parallel to the longest dimension of the elements is applied).

Figure 5:
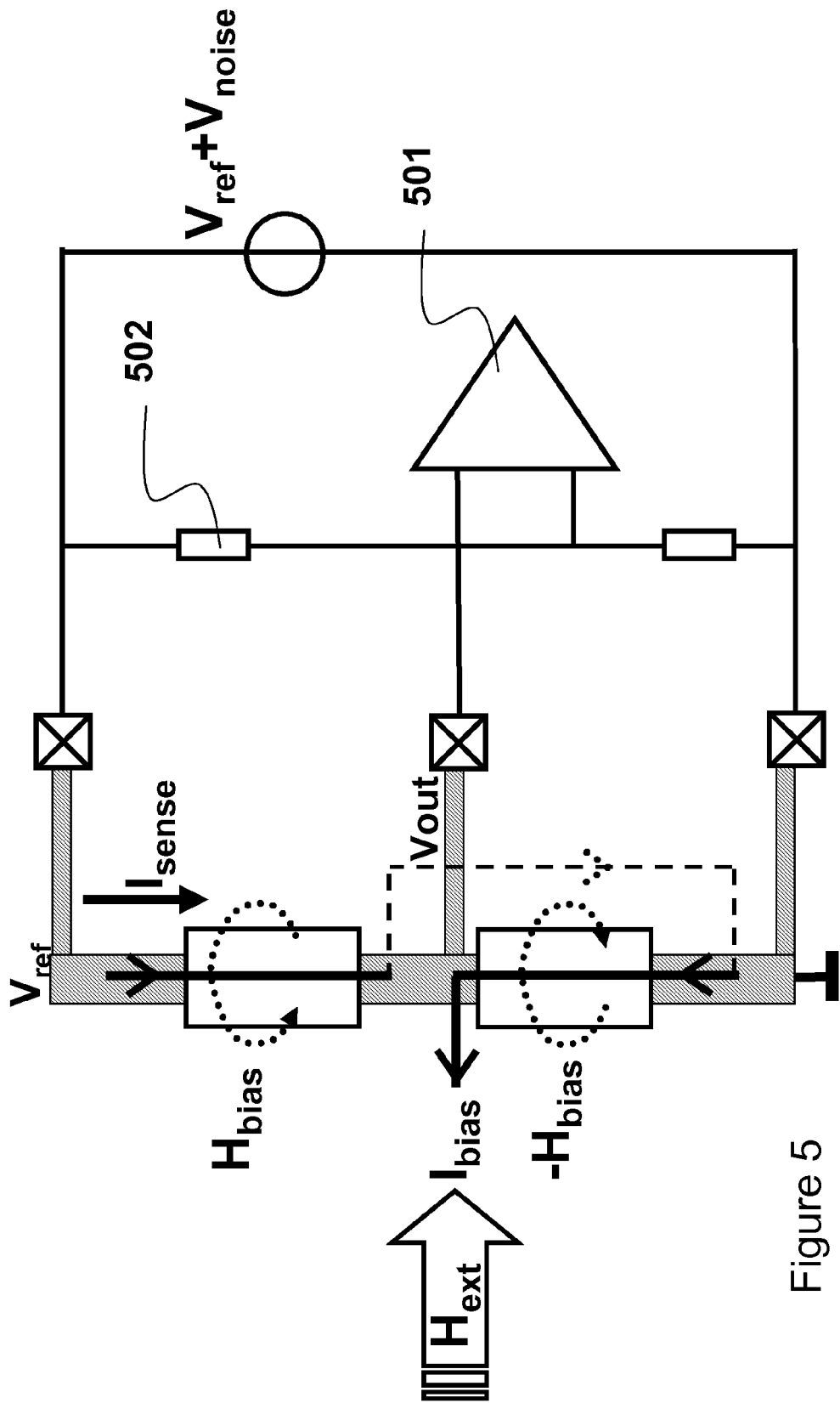
FIG. 5 shows the sensor FIG. 3 with one possible readout circuit.

A possible read-out circuit is displayed in FIG. 5. The AMR half-bridge output terminal indicated by $V_{out}$ is connected to one input terminal of the differential amplifier (501). The other input terminal of the amplifier is connected to the middle of a resistor divider (502) which outputs half the reference voltage. In this way noise on the supply is suppressed by the equality of the two half bridges.

Figure 6:
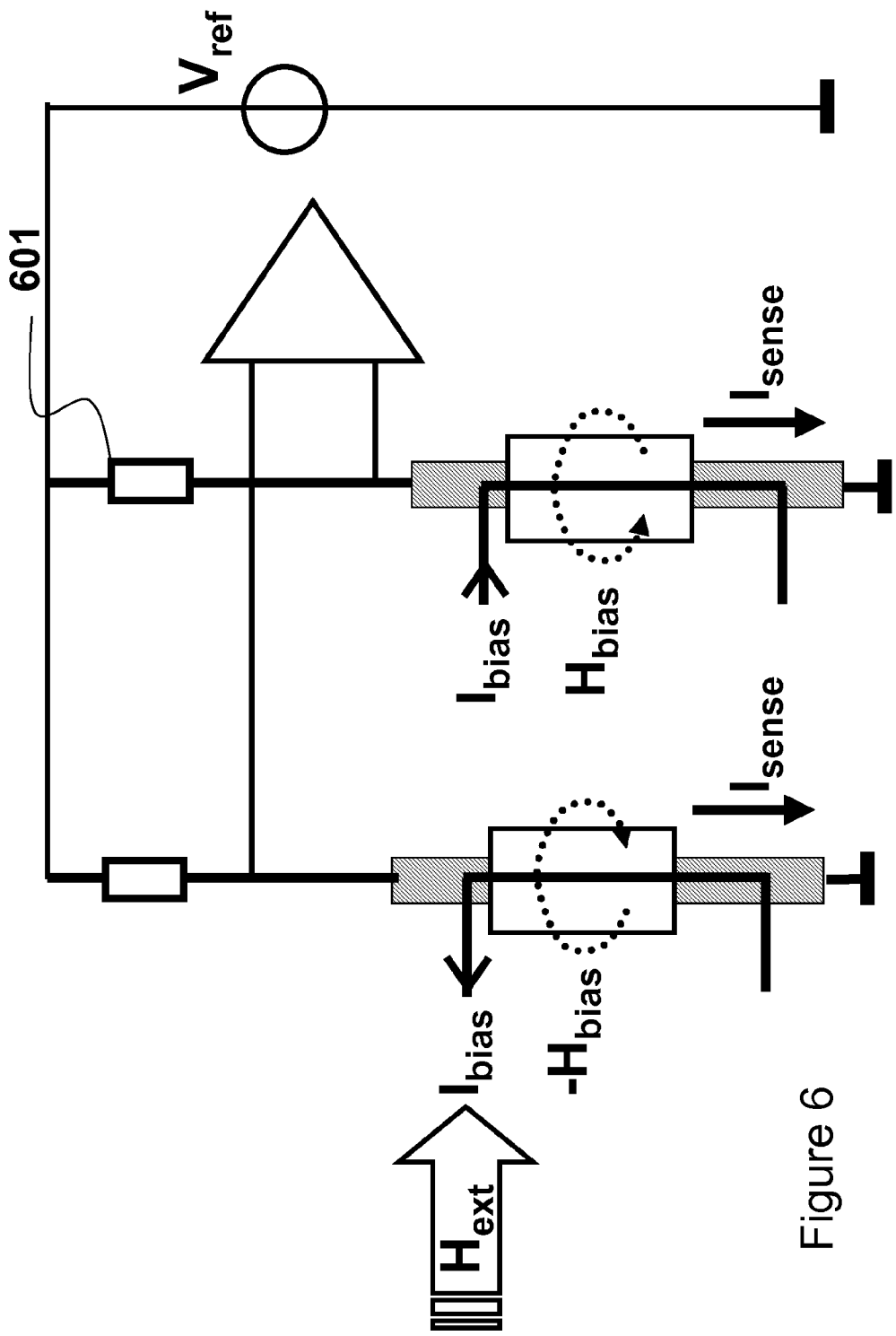
FIG. 6 shows a second example AMR sensor of the invention with associated readout circuit.

Other possible circuit implementations for the two sensors in FIG. 5 are shown in FIG. 6, in which the first and second sensor elements are in parallel with respective output voltages provided to a differential amplifier.

The two AMR sensors can be supplied with sense currents using separate resistors (as shown), 2 separate current sources, or any other device (601) that supplies sense currents to the AMR sensors. Furthermore the other (lower) side of the AMR sensors may be connected to ground or an arbitrary DC voltage. The AMR sensors can be biased in an arbitrary way, as long as $H_{bias}$ has a part parallel to $H_{ext}$. The coils on top of the AMR sensors can be connected in various ways. Either two separately connected coils or two coils in series on chip can be used, as long as the current direction through the coils is such that the current generates opposite bias field components parallel to $H_{ext}$ at the two sensor positions. The coils can also be connected in parallel.

Figure 7:
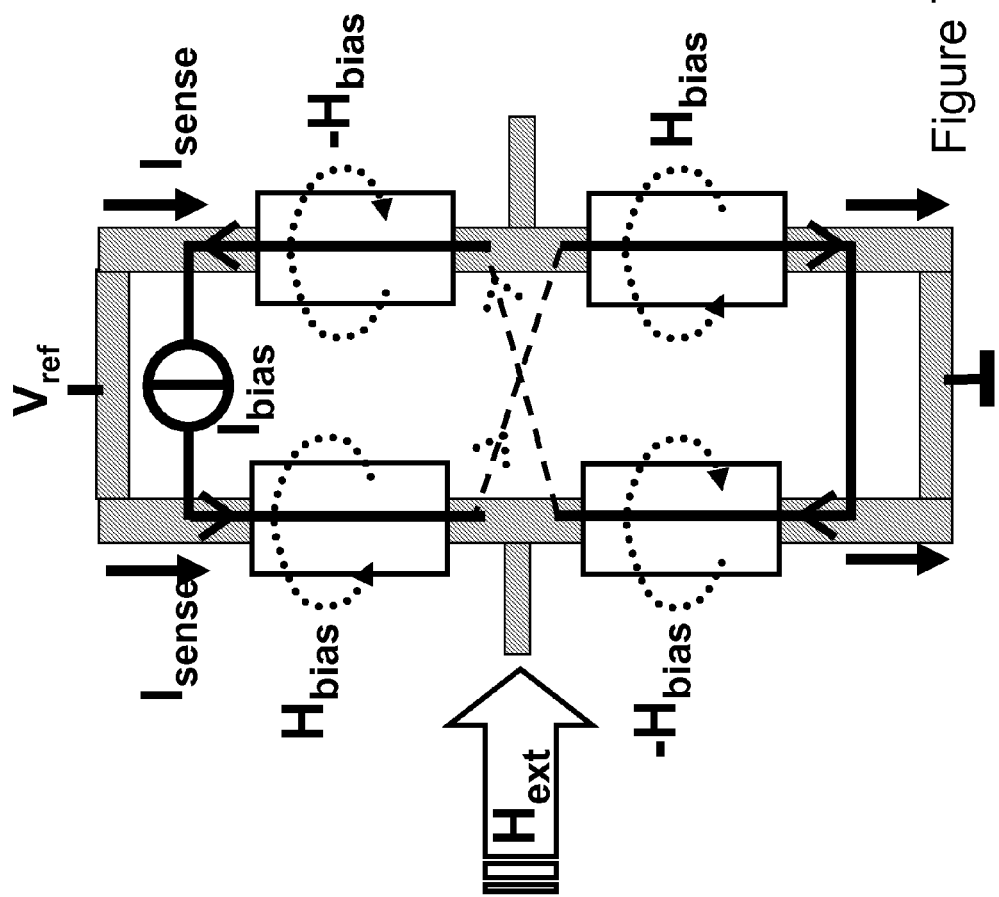
FIG. 7 shows a third example AMR sensor of the invention using four AMR elements in a bridge configuration.

A 'truly differential' configuration is shown in FIG. 7. Four AMR sensors are used in this full bridge. The coil currents are connected in such a way, that the two AMR half-bridges are working in opposite bias points. The proper bridge behavior is obtained when neighboring elements experience opposite bias fields, see the bias-field signs in FIG. 7.

In this design, a first branch comprises a first AMR sensor element to which the first DC bias field is applied and a second AMR sensor element to which the second DC bias field is applied, in series from a high to low supply terminal; and a second branch comprises a first AMR sensor element to which the second DC bias field is applied and a second AMR sensor element to which the first DC bias field is applied, in series from the high to low supply terminal.

This four AMR bridge configuration increases the sensitivity of the whole configuration by a factor of two over that of the half bridge with only two AMRs. The two input terminals of a differential amplifier can be directly connected to the two outputs of the two half-bridges. In this four-sensor bridge, the best equality of all four elements of the full bridge is obtained under all circumstances. This gives the bridge (besides its maximum output) the best possible common mode rejection ratio, so that all type of common errors (like temperature drift, supply noise etc.) are optimally suppressed.

The detailed design of the individual AMR sensor elements has not been given, as these are completely conventional. An AMR sensor element is a device which operates based on the property of a material in which a dependence of electrical resistance on the angle between the direction of electrical current and orientation of magnetic field is observed. The effect is attributed to a larger probability of s-d scattering of conduction electrons in the direction of the magnetization. The net effect is that the electrical resistance has maximum value when the direction of current is parallel to the magnetization direction. AMR effects of up to 50% has been observed in some ferromagnetic uranium compounds.

Various modifications will be apparent to those skilled in the art.

The invention claimed is:

1. An anisotropic magnetoresistive sensor, comprising:
    at least a first and a second anisotropic magnetoresistive sensor element;
    means for applying a first DC bias field (Hbias) to the first AMR sensor element and a second, opposite, DC bias field (–Hbias) to the second anisotropic magnetoresistive sensor element;
    means for combining outputs of the first and the second anisotropic magnetoresistive sensor elements to derive a sensor response which is substantially anti-symmetric in a region close to zero external magnetic field; and
    means for detecting a zero crossing of the external magnetic field ($H_{ext}$), meaning $H_{ext}=0$, wherein such detection is based on the substantially anti-symmetry of the sensor response in the region close to zero external magnetic field.

2. A sensor as in claim 1, wherein the means for applying a DC bias provides the first DC bias field (Hbias) with a component in a first sensitive direction and provides the second DC bias field (–Hbias) with a component in an opposite sensitive direction.

3. A sensor as in claim 1, wherein the means for applying a DC bias comprises at least one coil in proximity to the sensor elements.

4. A sensor as in claim 1, wherein the means for combining comprises a circuit configuration with the first and the second sensor elements in series with an output voltage (Vout) defined at a junction between the sensor elements such that the output voltage is dependent on a difference between the resistances of the sensor elements.

5. A sensor as in claim 4, further comprising a differential amplifier for measuring the output voltage with reference to a reference voltage.

6. A sensor as in claim 1, wherein the means for combining comprises a circuit configuration with the first and the second sensor elements connected to input terminals of a differential amplifier.

7. A sensor as in claim 1, further comprising at least two pairs of anisotropic magnetoresistive sensor elements in two parallel circuit branches.

8. A sensor as in claim 7, wherein:
    the first branch comprises a first anisotropic magnetoresistive sensor element to which the first DC bias field (Hbias) is applied and a second anisotropic magnetoresistive sensor element to which the second DC bias field (–Hbias) is applied, in series from a high (Vref) to low supply terminal; and
    the second branch comprises a first anisotropic magnetoresistive sensor element to which the second DC bias field (–Hbias) is applied and a second anisotropic magnetoresistive sensor element to which the first DC bias field (Hbias) is applied, in series from the high (Vref) to low supply terminal.

9. A sensor as in claim 1, wherein the external field to be detected is aligned along a most sensitive direction of the anisotropic magnetoresistive sensor elements.

10. A sensor as in claim 9, wherein the external field during the zero-field crossings is aligned substantially perpendicular to each of the anisotropic magnetoresistive sensor elements.

11. An anisotropic magnetoresistive sensing method, comprising:
    applying a first DC bias field (Hbias) to a first anisotropic magnetoresistive sensor element;
    applying a second, opposite, DC bias field (–Hbias) to a second anisotropic magnetoresistive sensor element;
    combining outputs of the first and the second anisotropic magnetoresistive sensor elements to derive a sensor response which is substantially anti-symmetric in a region close to zero external magnetic field, and;
    detecting a zero crossing of the external magnetic field ($H_{ext}$), meaning $H_{ext}=0$, wherein such detection is based on the substantially anti-symmetry of the sensor response in the region close to zero external magnetic field.

12. A method as in claim 11, wherein applying a DC bias comprises:
  providing the first DC bias field (Hbias) with a component in a first sensitive direction and
  providing the second DC bias field (−Hbias) with a component in an opposite sensitive direction.

13. A method as in claim 11, wherein the combining comprises:
  providing the first and the second sensor elements in series, with an output voltage (Vout) defined at a junction between the sensor elements such that the output voltage is dependent on a difference between resistances of the sensor elements.

\* \* \* \* \*